(12) United States Patent
Reed et al.

(10) Patent No.: US 6,310,908 B1
(45) Date of Patent: Oct. 30, 2001

(54) DIGITAL TO ANALOGUE CONVERTER IMPLEMENTATION

(75) Inventors: Christopher John Reed, Potters Bar; Simon Gale, Bishop's Stortford, both of (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/178,015

(22) Filed: Oct. 23, 1998

(51) Int. Cl.[7] .................................................. H04L 25/00
(52) U.S. Cl. ............................................................. 375/216
(58) Field of Search ..................................... 375/216, 295; 341/144, 126, 110, 58, 59; 708/313

(56) References Cited

U.S. PATENT DOCUMENTS

| | | | |
|---|---|---|---|
| 5,534,828 | * | 7/1996 | Okada et al. .......................... 332/103 |
| 5,783,974 | * | 7/1998 | Koslov et al. ......................... 332/103 |
| 6,052,701 | * | 4/2000 | Koslov et al. ......................... 708/313 |

* cited by examiner

*Primary Examiner*—Chi Pham
*Assistant Examiner*—Khai Tran
(74) *Attorney, Agent, or Firm*—Lee, Mann, Smith, McWilliams, Sweeney & Ohlson

(57) ABSTRACT

Current telecommunications device transmission stages require a significant number of analogue (DAC) components. The present invention provides a digital to analogue converter implementation for coupling to the digital signal processing (DSP) stage of the device and comprises a DAC and means to nullify the output of the DAC over part of the DSP data output period to produce a series of pulses corresponding to this data. The pulses are bandpass filtered to produce an analogue output signal at an intermediate frequency.

11 Claims, 6 Drawing Sheets

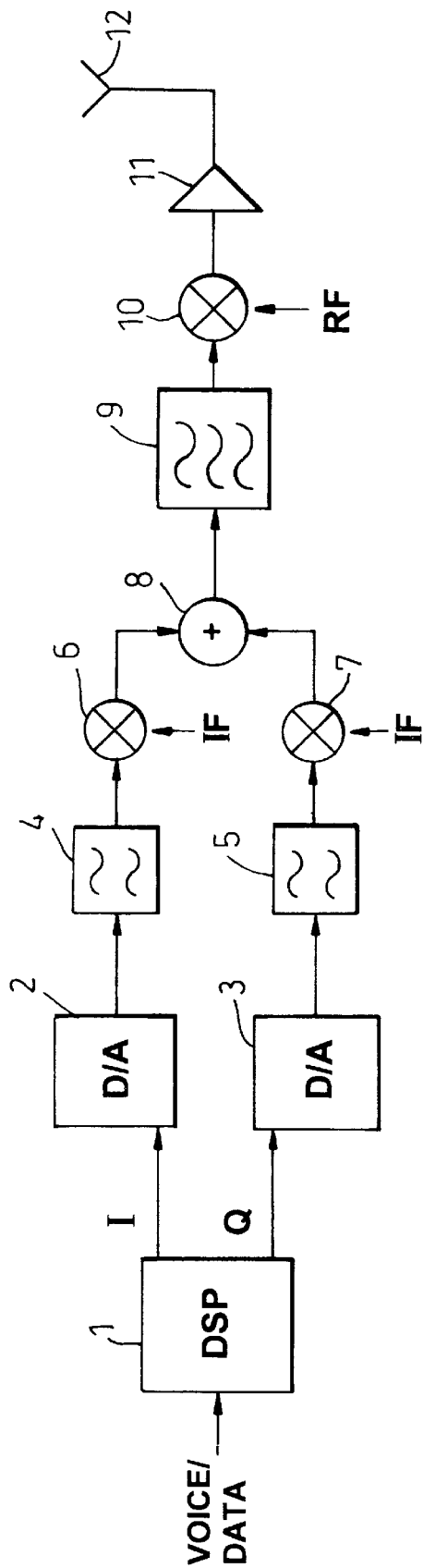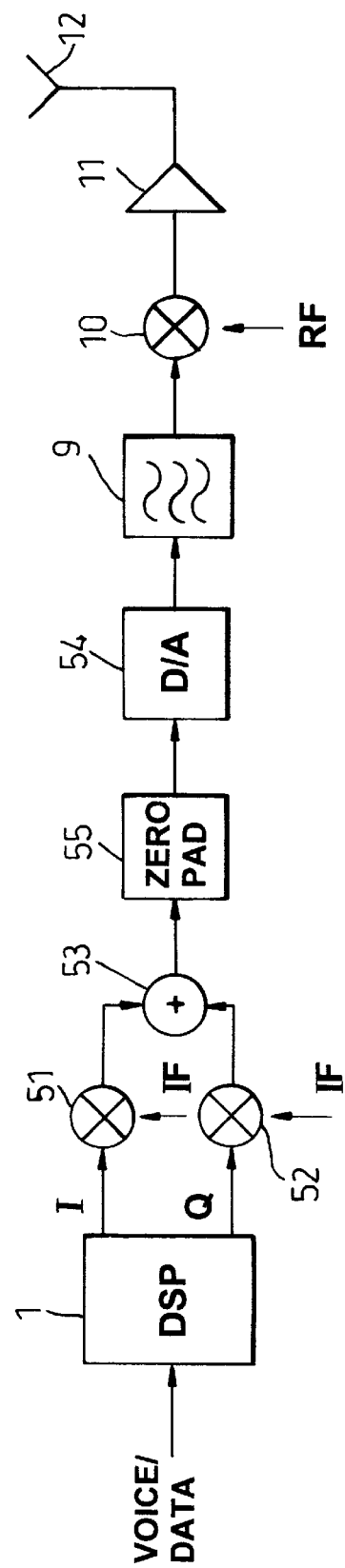

DIGITAL TO ANALOGUE CONVERTER IMPLEMENTATION

TECHNICAL FIELD

The present invention relates to digital telecommunications system transmitters and in particular to a digital to analogue converter implementation for such a transmitter which directly produces an analogue intermediate or radio transmission frequency output.

PRIOR ART

A typical prior art transmission stage for a digital telecommunications system is shown schematically in FIG. 1. In-phase and quadrature outputs from a digital signal processing (DSP) unit are converted to analogue signals which are low pass filtered to eliminate any high frequency components. The filtered analogue signals are up-converted to an intermediate frequency, and then combined to produce the full intermediate frequency (IF) signal. This IF signal is filtered and up-converted again to the final radio transmission frequency (RF) which is then amplified and transmitted. Such prior art arrangements require a large analogue section with a high number of components contributing to both the size and cost of the overall transmitter.

OBJECT OF THE INVENTION

It is an object of the present invention to provide an improved transmission stage for a digital telecommunications system.

SUMMARY OF THE INVENTION

The invention provides a digital to analogue converter implementation for coupling to a telecommunications digital signal processing means having a predetermined data output period, the converter implementation comprising:
 a digital to analogue converter (DAC);
 means for nullifying the output of said DAC over a predetermined part of each said data output period to form a pulse corresponding in amplitude to the data value associated with said period; and
 a band pass filter coupled to said output;
wherein said output is bandpass filtered at a non fundamental frequency band to produce an analogue output signal in said frequency band.

For the purposes of the specification, nullifying the output of the DAC means forcing the output voltage to zero or a DC offset voltage representative of zero input.

Preferably said nullifying means is a zero-padding means coupled to the DAC input. For the purposes of the specification, the term zero-padding means adding zero value words to the DAC input for 2's compliment data or mid-scale value words representative of zero input for other data numbering schemes.

Alternatively said nullifying means is an analogue switch coupled to the output of said DAC and arranged to switch said output to zero or a DC offset representative of zero input for said predetermined part of each sample period of the DAC.

Preferably said predetermined part is at least 75% of said data output period. Preferably said predetermined part is at least 87.5% of said data output period.

Preferably the converter implementation further comprises means for forming a second pulse of opposite sense to said first pulse over a second predetermined part of each said data output period.

Preferably said second predetermined part is at most 25% of said data output period and said first predetermined part is at least 50% of said data output period. Preferably said second predetermined part is at most 12.5% of said data output period and said first predetermined period is at least 75% of said data output period.

Preferably said implementation further comprises an in-phase and a quadrature digital signal up-converter, and an in-phase and quadrature digital combiner connected to combine said up-converted in-phase and quadrature digital signals, the output of said combiner being coupled to the input of said DAC. Preferably said up-converters and said combiner form part of the digital signal processing means, although separate components could be used.

In a second aspect, the present invention provides a telecommunications transmitter comprising:
 a digital signal processing means having a predetermined data output period and comprising: an in-phase and a quadrature signal up-converter; and an in-phase and quadrature combiner connected to combine said up-converted in-phase and quadrature signals;
 a digital to analogue converter (DAC), having an input coupled to said combiner;
 means for nullifying the output of said DAC over a predetermined part of each said data output period to form a pulse corresponding in amplitude to the data value associated with said period; and
 a bandpass filter coupled to said output;
wherein said output is bandpass filtered at an intermediate or radio transmission frequency to produce an analogue output signal at said frequency.

Preferably said transmitter further comprises:
 an RF up-converter coupled to the output of said filter;
 an RF amplifier means coupled to the output of said RF up-converter; and
 an antenna arrangement coupled to the output of said amplifier means.

In a further aspect, the present invention provides a method for up-converting and analogue converting digital telecommunications transmission signals having a predetermined data output period for a telecommunications transmitter comprising a digital to analogue converter (DAC) having an output coupled to a bandpass filter, the method comprising the steps of:
 converting said digital signals to analogue signals using said DAC whilst nullifying the output of said DAC over a predetermined part of each said data output period to form a pulse corresponding in amplitude to the data value associated with said period; and
 bandpass filtering said output at an intermediate frequency to produce an analogue output signal at said frequency.

BRIEF DESCRIPTION OF THE DRAWINGS

In order to show how the invention may be carried into effect, embodiments of the invention are now described below by way of example only and with reference to the accompanying figures, in which:

FIG. 1 is a schematic diagram of a prior art transmission stage for a digital telecommunications system;

FIG. 2 is a schematic diagram of a first preferred embodiment transmitter of the invention;

DETAILED DESCRIPTION

Figure 3:
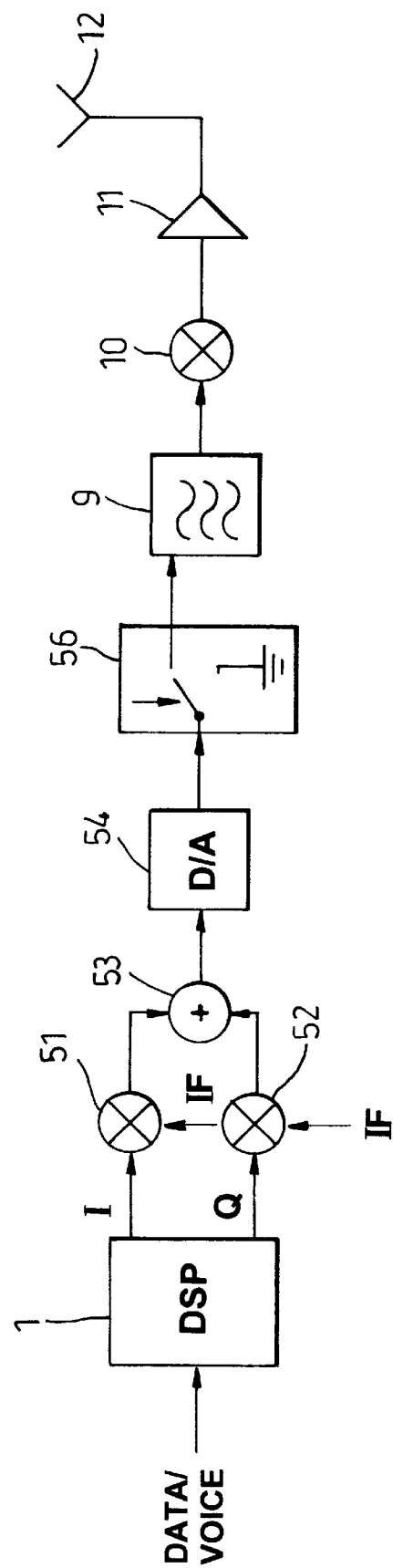
FIG. 3 is a schematic diagram of a second preferred embodiment transmitter of the invention.

Referring to FIG. 1, a prior art transmission stage for a digital telecommunications system is shown which comprises a digital signal processing (DSP) unit 1, two DAC's 2 and 3; two low pass filters 4 and 5; two up-converters 6 and 7; a combiner 8; a bandpass filter 9; an RF up-converter 10; an amplifier 11; and an antenna arrangement 12.

Data and/or voice signals are processed by the DSP1 to produce in-phase (I) and quadrature (Q) digital transmission signals in known manner. These two digital signals are converted to analogue signals by respectively, DAC's 2 and 3, the analogue signals being filtered to remove high frequency components by respectively, low pass filters 4 and 5. The filtered analogue I and Q signals are then up-converted to an intermediate frequency (IF) by respectively up-converters 6 and 7. The I and Q IF signals are then combined by combiner 8 to produce the complete IF analogue signal, which is then filtered by bandpass filter 9. The filtered IF signal is then further up-converted to the RF transmission frequency by RF up-converter 10, amplified by amplifying means 11, and fed to the antenna arrangement 12 for transmission.

Figure 4A:
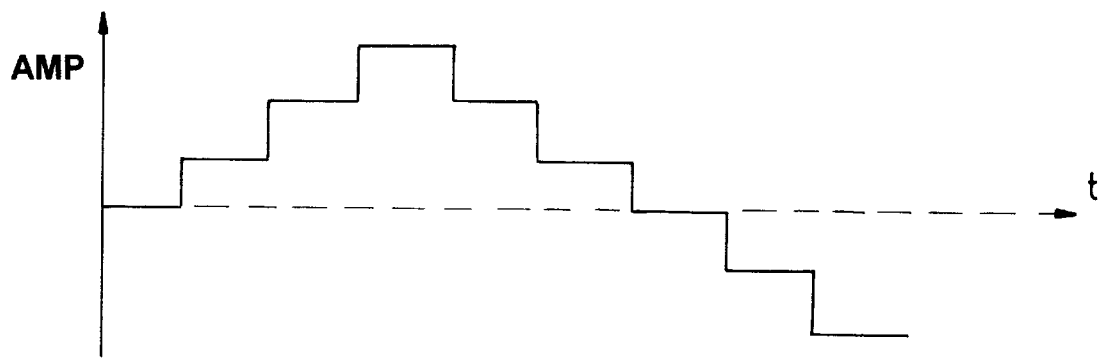
FIGS. 4(a) and (b) show respectively, the time domain DAC output of the prior art arrangement of FIG. 1, and the first preferred embodiment transmitter of FIG. 2.

The time domain output of one of the DAC's 2 or 3 is shown in FIG. 4(a). For each sample period of the DAC 2 or 3, the output corresponds to the digital word fed to the input of the DAC during that period. The output can be seen to vary in a series of steps, the amplitude of each step corresponding to the digital word at the DAC's input during the sample period (which corresponds to the width of the step).

Figure 5A:
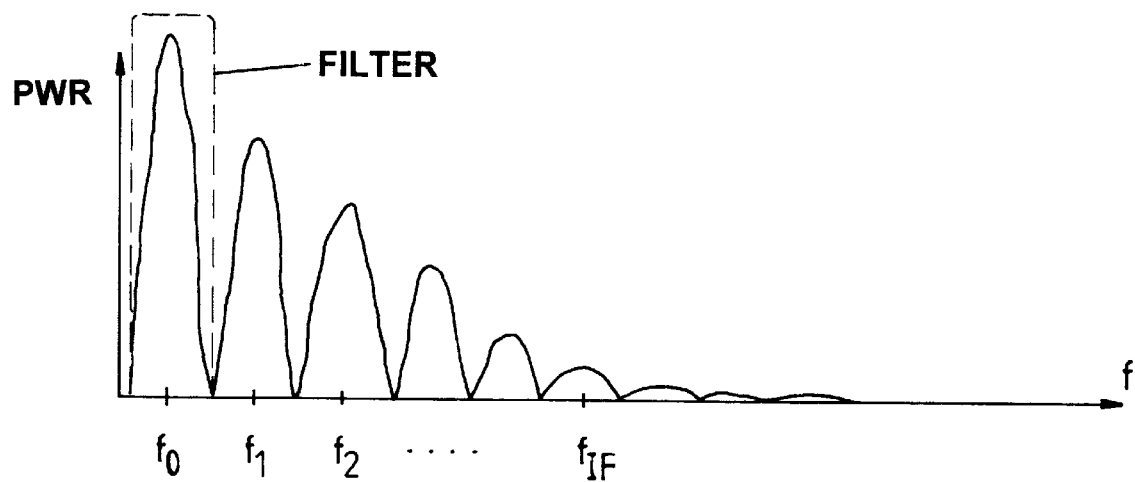
FIGS. 5(a) and (b) show respectively, the frequency domain plots of FIGS. 4(a) and 4(b)

The frequency spectrum of this "staircase" wave form can be seen in FIG. 5(a) which shows the fundamental frequency image $F_0$ of the wave form formed by the stepped output of the DAC. The frequency spectrum also contains harmonics of the frequencies of this image creating alias images of the fundamental image at $F_1, F_2, F_3, \ldots F_n$). These alias images however are significantly attenuated compared with the fundamental $F_0$, which is low-pass filtered then up-converted to IF as described above.

A first preferred embodiment transmitter of the invention is shown in FIG. 2 and comprises a digital signal processing unit 1 (DSP), two digital up-converting means 51 and 52, a digital combiner 53, a DAC 54, a zero-padding means 55, a band pass filter 9, an RF up-converter 10, an amplifying means 11, and an antenna arrangement 12. Components which are common with the prior art arrangement of FIG. 1 are commonly referenced.

Voice and/or data signals are processed by a DSP1 to produce in-phase I and quadrature Q digital transmission signals. These two outputs are digitally up-converted to an intermediate frequency (IF) using respectively digital up-converting means 51 and 52. The up-converted digital I and Q signals are then combined by digital combiner 53 to produce the complete (I+Q) digital IF signal. This signal is then zero-padded using zero-padding means 55 such that for every digital word of the IF signal, one or more "zero" value are added to the signal, which is then fed to the input of the DAC 54. The addition of zero words requires the DAC sampling period to be reduced by a factor corresponding to the number of zero words added per IF signal word. For example if three "zero" words are added to each IF signal word, the DAC sampling period will have to be one quarter of the predetermined data output period, the IF signal words, of the DSP1. The zero padding means 55 may be implemented by any suitable digital circuit as are known in the art.

Figure 4B:
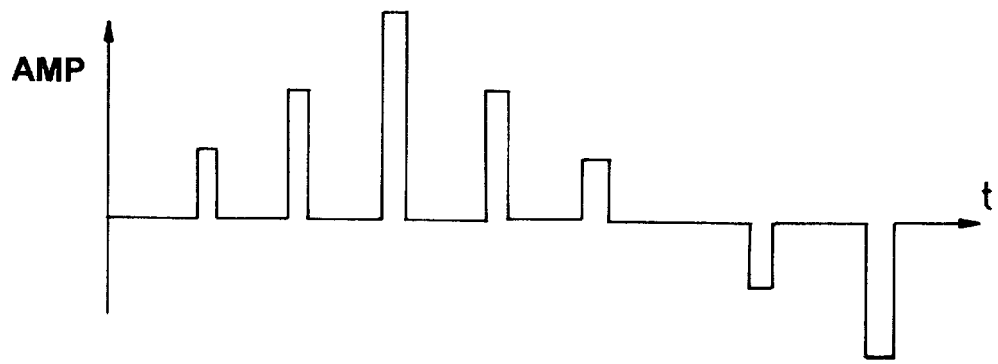

The effect of the zero-padding is to effectively switch off or nullify the output of the DAC 54 during part of the IF signal word or DSP date output period such that the DAC output appears as a series of pulses as shown in FIG. 4(b). Each pulse corresponds in amplitude to the IF signal word of a DSP data output period, but this amplitude is not maintained for the entire data output period as would be the case in prior art arrangements (see FIG. 4(a)). Instead, the output is nullified or "zeroed" for part of the IF data output period. Considered another way, the IF signal word is only represented at the DAC output for one DAC sample period, the remaining DAC sample periods within the DSP data output period correspond to the zero value amplitude associated with the zero padding words. Therefore, instead of the "staircase" wave form produce d by the DAC in prior arrangements, a series of narrow pulses is produced, the amplitude of each pulse (see FIG. 4(b)) being equal to the amplitude of a corresponding step produced by a DAC without the nullifying means implemented (compare with FIG. 4(a)).

Figure 5B:
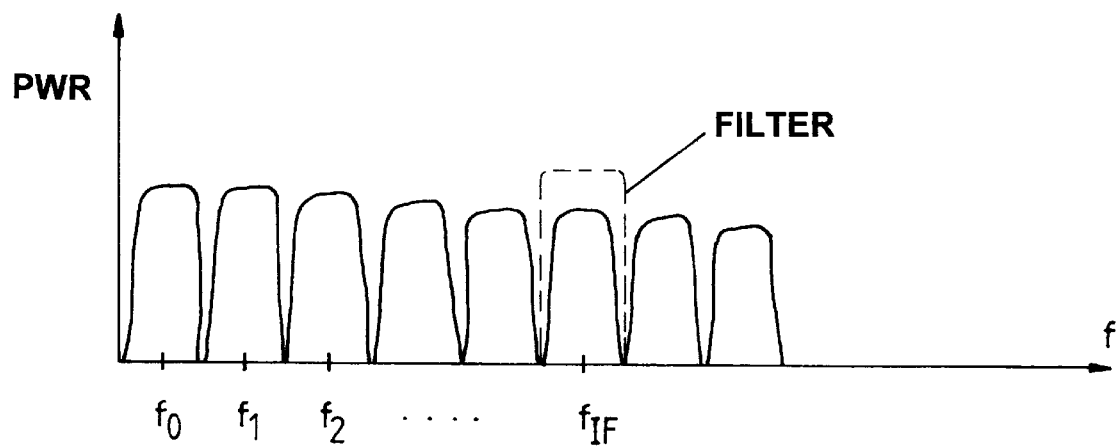

The frequency spectrums of the prior art "staircase" and present inventive arrangements "pulse" wave forms can be see n in FIGS. 5(a) and 5(b) respectively. The "staircase" wave form produces a high power fundamental frequency image ($F_0$), together with a number of much reduced power aliases corresponding to harmonics of the fundamental at $F_1$, $F_2, F_3, \ldots F_n$. The pulse wave form of the inventive arrangement by contrast produces a fundamental image ($F_0$) together with a number of similarly powered aliases at harmonic frequencies ($F_1, F_2, F_3, \ldots F_n$). As can be seen in FIG. 5(b), there is only a slow roll-off or reduction in alias power as the alias frequencies increase through the harmonics range. As the power of the high frequency aliases is comparable to that of the fundamental frequency image ($F_0$), one of these high frequency aliases can be bandpass filtered off as the analogue intermediate frequency signal. This is achieved with the employment of bandpass filter 9 at a non-fundamental frequency band. Preferably this is centred at an intermediate frequency IF, however a radio transmission frequency image may be directly filtered off for transmission. This is not practical with the prior art arrangements (see FIG. 5(a)), as a corresponding IF or RF alias has too little power due to the "staircase" wave form frequency spectrum, harmonic related aliases rapidly reducing in power as frequency increases.

In the preferred arrangement, the IF analogue signal is then up-converted to transmission frequency by the RF converter 10, and is then amplified by amplifier means 11 before being fed to the antenna arrangement 12 for transmission.

In practice, the digital up-converting 51 and 52, and the digital combiner 53 will likely be implemented within the DSP1. The zero-padder 55 may also be implemented by the DSP1, although separate components could be used for all these elements.

The inventive arrangement requires considerably fewer analogue components than the prior art arrangement. This has both cost and space saving advantages, and brings the digital domain closer to the antenna arrangement which simplifies the design as well as producing greater reliability and an improved signal quality. While the DAC 54 implemented by the inventive arrangement requires a higher sampling performance than those of the prior art, only a single DAC is required and the requirement for two analogue low pass filters (4 and 5), two analogue up-converters (6 and 7), and an analogue combiner (8) is also obviated.

For a transmission frequency of 1900 MHz the preferred intermediate frequency is approximately 74 MHz; the zero-padding means 55 introduces 7 zero words per transmission word; and the DAC 54 has a sampling rate of approximately 150 MHZ. The bandpass filter 9 is preferably a SAW filter.

FIG. 3 shows a second preferred embodiment transmitter of the invention which is similar to the first preferred embodiment of FIG. 2, like components being referenced the same. Instead of the zero-padding means 55 of the first preferred embodiment, the pulse-like wave form of FIG. 4(*b*) is achieved by an on/off analogue switch 56 connected at the output of the DAC 54. In this arrangement the DAC 54 output is similar to the "staircase" output of FIG. 4(*a*) (but at IF), however this output is nullified over part of the sampling period to produce narrow pulses of a width less than the sampling period, and of an amplitude the same as the corresponding "staircase" wave form step; as shown in FIG. 4(*b*). The switch 56 nullifies the output of the DAC over part of its sampling period by grounding the output or forcing it to a mid-scale voltage representative of zero for DC offset outputs. As with the zero-padding embodiment of FIG. 2, this produces the pulse wave form of FIG. 4(*b*) and the frequency spectrum of FIG. 5(*b*). A high frequency alias can then be bandpass filtered as described above to provide an analogue IF output for RF up-converting, amplification and final transmission.

Preferably the analogue on/off switch 56 is implemented by a fast analogue switch driven by a repetitive narrow pulse generator (not shown). There are many other implementations well known within the art which could alternatively be used.

Figure 6A:
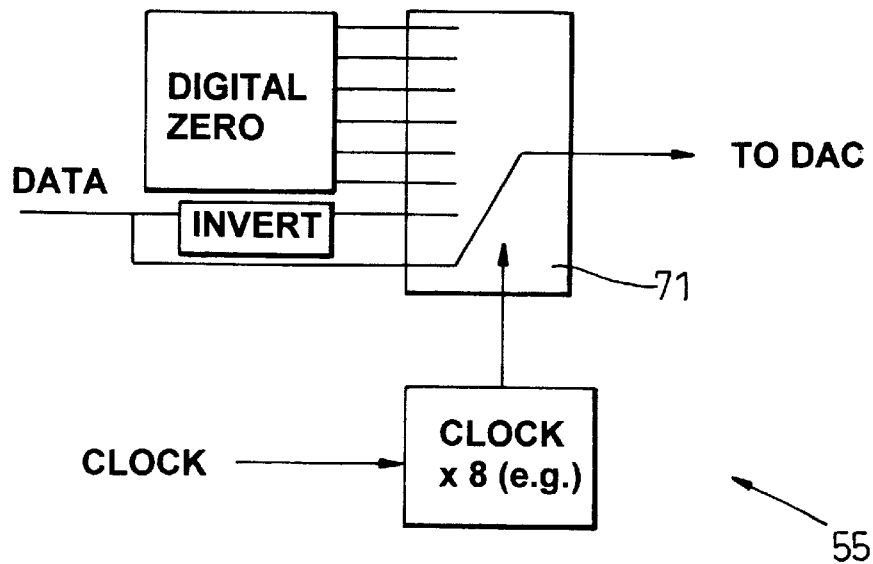
FIGS. 6(a) and (b) show respectively schematic circuit diagrams for an improved zero padding means for the first preferred embodiment of FIG. 2, and an improved analogue switch arrangement for the second preferred embodiment of FIG. 3.
Figure 6B:
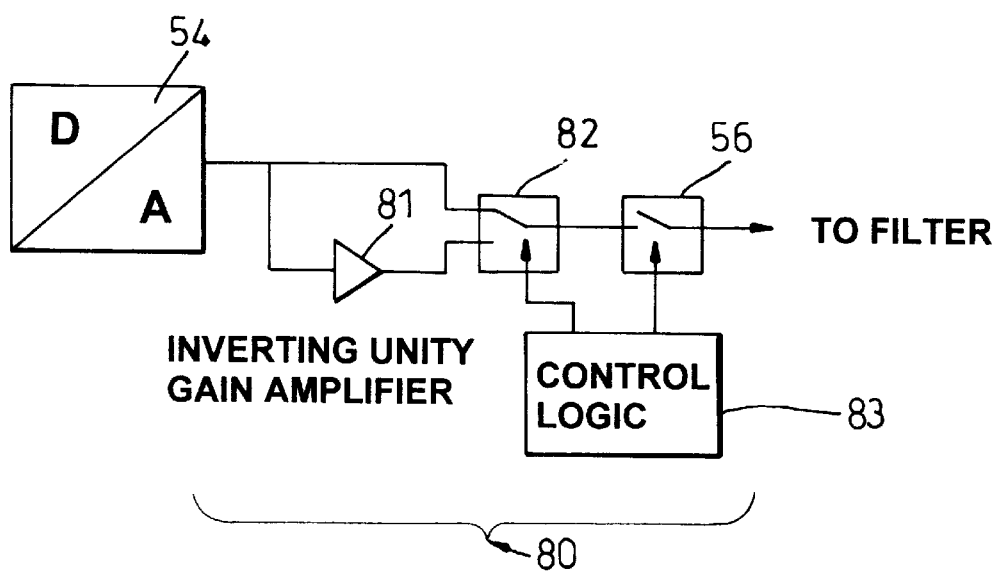

FIGS. 6(*a*) and (*b*) show schematic circuit diagrams for respectively, a zero padding means (55) of the first preferred embodiment of FIG. 2, and an improved analogue switch arrangement (80) of the second preferred embodiment of FIG. 3.

Referring to FIG. 6(*a*), the improved zero padding means 55 comprises a digital circuit comprising a multiplexer 71 having an output connected to the DAC 54 and driven at a clock speed eight times that of the incoming IF signal word. The multiplexer 71 switches between eight inputs over an IF signal word data period; six of the inputs corresponding to digital zero or zero value words, one input corresponding to the IF signal word, and the remaining input corresponding to the digital inverse of the IF signal word. The input reaching the DAC over an IF signal word data period (corresponding to the DSP data output period) therefore comprises this word value, its inverse, and six zero value words. Other combinations of multiplexer inputs could be employed to vary pulse, inverse pulse, and zero value duration within an IF signal word data period.

Figure 7A:
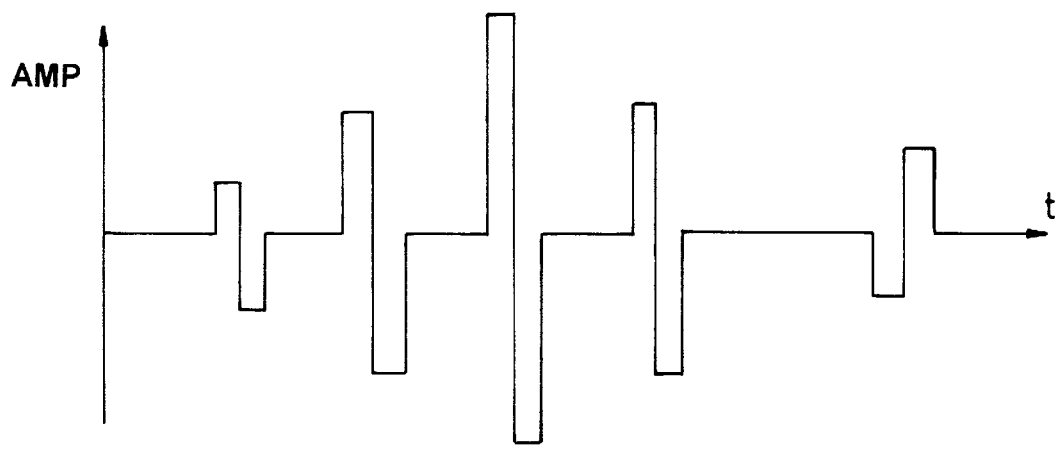
FIGS. 7(a) and (b) show respectively the time domain DAC output and the corresponding frequency domain plot for the first and second preferred embodiment transmitter arrangements incorporating the improved circuit stages of FIGS. 6(a) and (b) respectively.
Figure 7B:
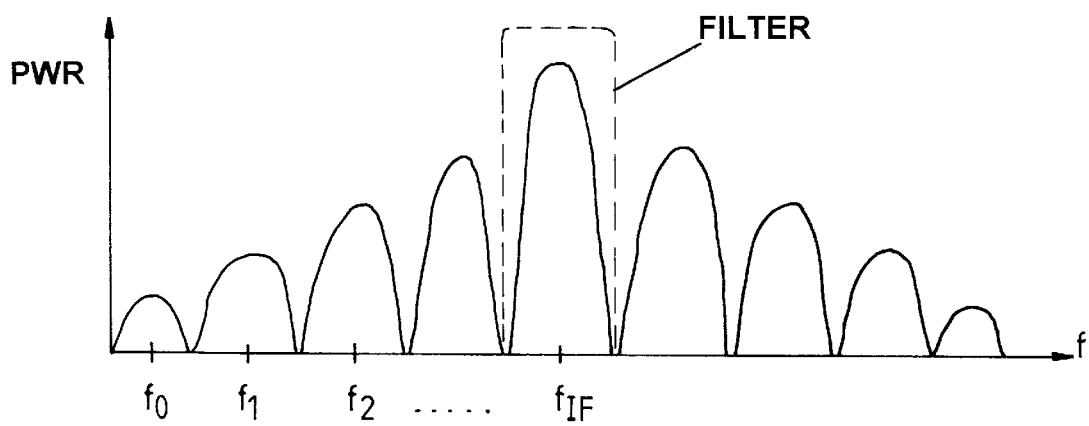

FIG. 7(*a*) shows the time domain DAC output for such an input, and comprises a pulse corresponding to the IF signal word as previously described, and in addition a pulse of equal amplitude but of opposite sense (or analogue value) which corresponds to the inverse IF signal word input. For a zero voltage centred output, a pulse of opposite sense corresponds to a pulse of equal but negative amplitude. The frequency spectrum plot of this output is shown in FIG. 7(*b*). It can be seen that the power of the frequency images or aliases generated increases up to an intermediate frequency and then falls off as the frequency increases further. With this generated spectrum, the fundamental frequency band comprises relatively little power compared to higher frequency images. The power of the frequency images tends to peak at the frequency corresponding to the pulse width, such that the highest power frequency image can be controlled by controlling the pulse width. This modified output allows easier filtering requirements on the bandpass filter 9 used to pick off the intermediate or transmission frequency. This further reduces the cost of the transmitter stage.

Referring to FIG. 6(*b*), the improved analogue switch arrangement 80 comprises a unity gain inverting amplifier 81, and an inverting analogue switch 82 connected to the on/off analogue switch 56. The inverting switch 82 switches between the DAC output and the inverse of the DAC output supplied by the inverting amplifier 81. Control logic 83 is arranged to switch the inverting switch 82 between non-inverted and inverted DAC outputs at the half way between the on/off analogue switch 56 "on" cycle. This ensures that the output of the on/off analogue switch comprises a non-inverted pulse corresponding to the output of the DAC, and in addition an inverted pulse of opposite sense but equivalent amplitude to the first pulse, followed by a zero value output as previously described. This output can be seen in the time domain in FIG. 7(*a*), and in the frequency domain in FIG. 7(*b*). As previously described, a high power frequency image can be passed by a suitable bandpass filter to obtain an intermediate or transmission frequency output. Again this arrangement allows easier filtering requirements on the bandpass filter 9.

In use, the inventive transmission stage of FIGS. 2 or 3 is implemented in a telecommunications device such as a handset or base station equipment, and is utilised for a transmission function within the device. Base stations typically employ 60–80 such transmission stages and therefore the above mentioned benefits of the inventive arrangement are significantly magnified in such a station.

Voice and/or data signals are processed by a DSP unit 1 in known manner to produce digital I and Q output signals which are up-converted to IF and combined. The combined digital IF signal is then zero-padded before conversion by a DAC to an analogue signal to produce a series of pulses according to the digital transmission IF words. Alternatively an analogue switch nullifies part of the DAC output to produce the series of pulses. These pulses are then bandpass filtered to derive an IF analogue signal which is then up-converted to RF, amplified, and transmitted by an antenna arrangement 12.

The foregoing describes the invention including a preferred form thereof. Alterations and modification as would be obvious to some one skilled in the art are intended to be incorporated within the scope hereof.

What is claimed is:

1. A digital to analogue converter implementation for coupling to a telecommunications digital signal processing means having a predetermined data output period, the converter implementation comprising:

a digital to analogue converter (DAC);

a nullifying circuit arranged to nullify the output of said DAC over a predetermined part of each said data output period to form a first pulse corresponding in amplitude to the data value associated with said period; and a band pass filter coupled to said output;

wherein said output is bandpass filtered at a non-fundamental frequency band to produce an analogue output signal in said frequency band.

2. A digital to analogue converter implementation as claimed in claim 1, wherein said nullifying circuit is a zero-padding circuit connected to the DAC input.

3. A digital to analogue converter implementation as claimed in claim 1, wherein said nullifying means is an analogue switch coupled to the output of said DAC and arranged to switch said output to zero value for said predetermined part of each sample period o the DAC.

4. A digital to analogue converter implementation as claimed in claim 1, wherein said output is nullified for 75% of said data output sample period.

5. A digital to analogue converter implementation as claimed in claim 1, wherein said output is nullified for 87.5% of said data output sample period.

6. A digital to analogue converter implementation as claimed in claim 1, wherein said implementation further comprises an in-phase and a quadrature digital signal up-converter, and an in-phase and quadrature digital combiner connected to combine said up-converted in-phase and quadrature digital signals, the output of said combiner being coupled to the input of said DAC.

7. A digital to analogue converter implementation as claimed in claim 1 further comprising means for forming a second pulse of opposite sense to said first pulse over a second predetermined part of each said data output period.

8. A digital to analogue converter implementation as claimed in claim 5, wherein said up-converters and said combiner form part of the digital signal processing means.

9. A telecommunications transmitter comprising:

a digital signal processing means having a predetermined data output period and comprising: an in-phase and a quadrature signal up-converter; and an in-phase and quadrature combiner connected to combine said up-converted in-phase and quadrature signals;

a digital to analogue converter (DAC), having an input coupled to said combiner;

a nullifying circuit arranged to nullify the output of said DAC over a predetermined part of each said data output period to form a pulse corresponding in amplitude to the data value associated with said period; and a bandpass filter coupled to said output;

wherein said output is bandpass filtered at an intermediate or radio transmission frequency to produce an analogue output signal at said frequency.

10. A telecommunications transmitter as claimed in claim 9 further comprising:

an RF up-converter coupled to the output of said filter;

an RF amplifier means coupled to the output of said RF up-converter;

an antenna arrangement coupled to the output of said amplifier means.

11. A method for up-converting and analogue converting digital telecommunications transmission signals having a predetermined data output period for a telecommunications transmitter comprising a digital to analogue converter (DAC) having an output coupled to a bandpass filter, the method comprising the steps of:

converting said digital signals to analogue signals using said DAC whilst nullifying the output of said DAC over a predetermined part of each said data output period to form a pulse corresponding in amplitude to the data value associated with said period; and bandpass filtering said output at a non-fundamental frequency band to produce an analogue output signal in said frequency band.

* * * * *